United States Patent Office 3,552,002

Patented Jan. 5, 1971

3,552,002

METHOD OF PRODUCING PRINTED CIRCUIT BOARDS

William J. Barron, Peru, Ill., assignor to Graphic Electronics, Inc., La Salle, Ill., a corporation of Delaware No Drawing. Filed Jan. 9, 1969, Ser. No. 790,147

Int. Cl. B41m *3/08*; H05k *3/00*

U.S. Cl. 29—625 10 Claims

ABSTRACT OF THE DISCLOSURE

A method of producing a printed circuit board by wrapping on a first cylinder a relatively thin, flexible blank of laminated circuit board material having a backing layer of insulating material and a thin surface layer of copper, wrapping on a second cylinder a sheet of copy material illustrating a desired design for a printed circuit board, rotating the two cylinders while scanning the copy with a light-sensitive scanner and using a scanner-controlled cutter to cut away and remove the thin copper surface layer from the laminated blank circuit board material except in the areas corresponding to the circuit design shown on the copy material.

BRIEF SUMMARY OF THE INVENTION

The present invention relates to a method for forming a printed circuit board without use of conventional photochemical etching techniques. Printed circuit boards have found wide acceptance in industry, and the commonly accepted technique for producing such boards is by means of a photochemical process. Thus, the desired circuit is first drawn on a sheet of paper or the like and is then placed in front of a camera and photographed with high contrast film, the film then being developed, fixed, washed and dried to produce a negative of the circuit design.

A blank circuit board having a backing of insulating material and a copper surface coating is then taken to a darkroom and treated on its copper surface with a photo-resist material of a type which is resistant to acid after being exposed to light. The blank printed circuit board is placed on a vacuum frame in the darkroom and the negative is placed in contact with the copper surface, after which light is introduced through the negative so as to expose the photo-resist material on the copper in all areas exposed to light, i.e., the areas covered by the circuit.

The copper-clad board is rinsed to wash away the photo-resist material in those areas not exposed to light, and thereafter the board is etched in an acid etching machine so that all portions of the copper surface which are not protected by the photo-resist material are eaten away, whereby the remaining copper forms the desired circuit. After the foregoing acid-etching process, the etched circuit board is normally run through a complex chemical cleaning machine, and finally the circuit board is further processed in a wave soldering machine for the purpose of applying a thin layer of tin solder or the like to the copper surface. The tin solder layer over the copper facilitates the subsequent soldering of various electrical connections to the circuit board.

The foregoing known process for making printed circuit boards, while generally accepted in the industry, does suffer from certain significant disadvantages. One problem which occurs relates to size instability, as caused for example by a slight shrinking of the film or negative during washing thereof. Obviously, any shrinking of the film will cause the completed printed circuit board to be somewhat smaller than the original copy, even though for many applications it is important that the size of the printed circuit board be maintained within very close tolerances.

Another serious problem which often arises with the foregoing photochemical etching process is that during the acid-etching process the acid will eat underneath the edge of the copper surface layer in an area intended to form part of the circuit, with the result that extremely fine detail such as a small dot or a very thin line of the circuit is broken away and lost. In other words, there is a natural tendency for the acid to work sideways as will as into the depth of the copper material, and such undercutting action can be a serious problem where very fine circuit detail is involved.

It is an object of the present invention to provide an improved method for producing a printed circuit board directly from original copy by using a light-sensitive scanner to scan the copy material and a cutter stylus controlled by the scanner to cut away and remove a thin copper surface layer from the insulated backing layer of laminated blank circuit board material so that the copper remaining thereon after the cutting operation forms the desired circuit as shown on the copy material.

Another more specific object of the invention is to provide a method as last above-mentioned wherein a sheet of copy showing a desired circuit design is wrapped on a rotatable scanning cylinder, and a blank copper-clad circuit board is wrapped on a rotatable cutter cylinder, and where a light-sensitive scanner is used to scan the copy and control a cutter stylus which is used to remove the copper surface layer from the laminated circuit board blank except in the areas which specifically comprise the desired circuit, the cutting operation being performed with a V-shaped stylus which completely avoids any problem of undercutting.

Another of my objects is to provide a method as described above, where the laminated circuit board blank comprises a backing of insulating material with a copper surface layer thereon, including the step of applying a thin coating of solder to the surface of the copper prior to the cutting operation.

A still further object of my invention is to provide a method of forming printed circuit boards as above described where the blank circuit board material is relatively thin and flexible so as to be easily wrapped on a rotatable cylinder for the cutting operation, and where subsequent to the cutting operation the completed circuit board is laminated to an additional layer of backing material which substantially increases the thickness and rigidity of the printed circuit board.

The foregoing and other objects and advantages of the invention will be apparent from the following description of a preferred embodiment thereof.

DETAILED DESCRIPTION OF THE INVENTION

In carrying out the method of the present invention, printed circuit boards may be produced with the use of an engraving machine of the general type disclosed in my U.S. Pat. 3,183,745. In essence, such an engraving machine includes a common cylinder axle on which two cylinders are mounted in spaced apart relation, the two cylinders thus being coaxial and being rotatable at the same speed by a drive motor operatively connected with the cylinder axle. One of the foregoing two cylinders may be referred to as the scanning cylinder, and the other as the cutting cylinder. An engraving machine of the type described includes a feed screw which is mounted parallel to the common cylinder axis in spaced relation thereto and carries two axially movable carriages thereon, one of which may be referred to as a cutter carriage and the other as a scanner carriage. The feed screw is rotated in an intermittent manner by a ratchet advance mechanism operated from the drive motor, as described in the aforementioned U.S. Pat. 3,183,745. The scanner carriage is mounted at one end of the feed screw and carries an electronic scanner in proximity to the rotatable scanning cylinder, while the cutter carriage is mounted on the other end of the feed screw and carries a scanner-controlled cutter head in proximity to the rotatable cutter cylinder.

In a machine of the foregoing type the feed screw is provided with oppositely formed threads at its two ends so that rotation thereof will advance the cutter and scanner carriages in opposite directions. However, in carrying out the method of the present invention, it will normally be necessary to advance the scanner and cutter carriages in the same axial direction, in which case one of the carriages may be disconnected from the feed screw and driven from the other carriage by a connecting rod as described in my U.S. Pat 3,372,618.

Because an engraving machine of the foregoing type is generally known in the art, it is not believed necessary to describe the same in detail herein. However, it will be understood that upon rotation of the two cylinders and intermittent rotation of the feed screw, the scanner will advance longitudinally along the rotating scanning cylinder and scan copy material wrapped thereon, and the scanner will transmit electrical impulses to a cutter head which is moving longitudinally along the cutter cylinder, the cutter head including a tungsten carbide stylus which is actuated by the foregoing electrical impulses to engrave a metal plate or the like which is wrapped on the cutter cylinder. A more complete description of an electronic engraving machine may also be found in U.S. Pat. 2,925,464, issued to A. O. Raible on Feb. 16, 1960.

In the practice of the present invention to manufacture printed circuit boards, it is first necessary to prepare a drawing or the like of the desired circuit design. The circuit drawing may be hand-drawn on paper with ink or pencil, or it may be prepared by other known techniques such as by applying to a sheet of paper selected sections of tape having circuit components preprinted thereon. While the method of preparation may vary, a hand drawing of the circuit prepared on a sheet of paper with either pencil or ink has been found to work quite satisfactorily. Once the circuit drawing is prepared, it is wrapped on a scanning cylinder of an engraving machine as described hereinabove and secured thereto.

A blank printed circuit board is wrapped on the cutter cylinder of the engraving machine. The blank printed circuit board should be of a laminated type having a backing layer of insulating material such as fiber glass and a surface layer of copper. It is also important that the blank circuit board material be relatively thin so that it will be quite flexible and thus easily wrapped on the cutter cylinder and secured thereto. The extreme end portions of the blank circuit board are heated and then bent to define an angle of approximately 45 degrees to the plane of the board, and the bent end portions are punched with a plurality of holes, the foregoing being to permit anchoring of the ends of the circuit board to the cutter cylinder by appropriate locking mechanism.

In accirdance with the foregoing objectives, I have found that the backing layer of insulating material should preferably be approximately 0.030 inch thick, and should not exceed 0.035 inch in thickness. In some applications, a substantially thinner backing layer may be utilized, and thus the preferred range of thickness for the backing layer is approximately 0.005 to 0.035 inch. With respect to the copper surface layer, it is preferred to use approximately two ounces of copper per square foot which produces a copper layer having a thickness of about 0.002 inch. Consequently, an example of a preferred laminated circuit board blank would comprise a backing of insulating material having a thickness of approximately 0.030 inch and a thin surface layer of copper having a thickness of approximately 0.002 inch, whereby the total thickness of the circuit board would be approximately 0.032 inch. Inasmuch as the thickness of the copper layer is normally quite small relative to the backing layer, the former is somewhat less critical, since variations thereof have only a relatively small effect on the total thickness of the circuit board material.

In accordance with the preferred embodiment of the present invention, the blank circuit board material has a very thin layer or coating of solder applied to the surface of the copper prior to the formation of the desired circuit thereon. The use of such a thin layer of solder is known in the art, but in conventional practice it is applied subsequent to the usual acid-etching process, since the solder would interfere with the intended action of the acid on the copper surface. However, in accordance with the present invention, a cutting stylus is used to remove copper from the surface of the circuit board, and the stylus readily cuts through the thin layer of solder. Thus, it has been found that pre-soldered circuit board material provides extremely good results.

Accordingly, the blank circuit board material should preferably have a thin layer of solder applied thereto prior to the cutting operation, as for example by electroplating the board material with a 0.0002 inch deposit of 60/40 lead/tin. A blank circuit board is thus wrapped on the cutting cylinder of the engraving machine and anchored thereto, and for purposes of the following description it will be assumed that the board material comprises a backing layer of fiberglass having a thickness of approximately 0.030 inch, a surface layer of copper having a thickness of approximately 0.002 inch, and a very thin coating of solder on the surface of the copper.

By using an engraving machine having a reversing switch to control the cutter head, it is possible to produce a printed circuit board by the method of the present invention either from positive or negative copy. It is contemplated that in most cases positive copy will be used, and consequently the engraving machine is preferably wired so that the power stroke of the cutter will occur when the scanner senses light, in which case no cutting will occur when the scanner scans a dark area on the copy.

It will be understood from the earlier description that when the engraving machine is operated, the scanning and cutting cylinders will be rotated, and the scanner and cutter carriages will be advanced along the length of their respective cylinders by the feed screw. If the copy which is wrapped on the scanning cylinder is right-reading, which it normally will be, then one of the two carriages should be disconnected from the feed screw and connected with the other carriage so as to be advanced thereby, in which case both carriages will be advanced in the same axial direction. The scanner will scan the copy material on the scanning cylinder, and when it senses light it will transmit electrical impulses to the cutter head to produce a cutter stroke. Consequently, assuming positive copy is used, the cutter will cut into the copper on the laminated circuit board in all areas corresponding to the light areas on the copy, whereas no cutting will occur in those areas on the circuit board which correspond to the dark areas on the copy, i.e., the outline of the desired circuit.

The stroke of the cutter stylus is preferably controlled by a suitable stop means associated therewith. In this manner, the cutter can be controlled so that it will always cut to the same predetermined depth. The preferred stroke is one which is sufficient to enable the stylus to cut completely through the thin copper surface layer without cutting very far into the backing of insulating material. The object is to completely remove the thin surface layer of copper from the backing material in those areas corresponding to the light areas on the image. Accordingly, in the foregoing example, where the copper surface layer is of a thickness of 0.002, the cutter must have a stroke whereby it will at least cut completely through the copper. It is preferable not to cut too deep into the backing layer, although a cutting depth of 0.01 inch will work satisfactorily in the foregoing example. The cutter stylus itself should be generally V-shaped, since with such a cutter configuration no undercutting will occur. Accordingly, fine detail can be preserved with much greater reliability than with the conventional acid-etching technique.

While the process described herein may generally be referred to as the engraving of a printed circuit board, it is believed more accurate to describe the process as involving the removal of a thin surface layer of metal from a layer of non-metallic backing material in all areas except those corresponding to the image of a circuit on a sheet of copy which is prepared to illustrate the design of a desired circuit. While the present invention may be used in the normal production of printed circuit boards, it is most advantageous when used for prototype and testing work.

In the past, many designers of printed circuits have had to draw up a proposed circuit and then send it out for outside processing by the conventional photo-chemical etching technique, often resulting in a substantial time interval between the drawing of a proposed design and the availability of a prototype for actual testing. In accordance with the present invention, by using a relatively inexpensive engraving machine, a designer can draw a proposed circuit and immediately wrap the drawing on a scanning cylinder as here described, and in a very short time, e.g., one hour for a small board, during which time the machine will run unattended, the designed can produce a prototype printed circuit board which can then immediately be tested to determine the feasibility of the design.

Printed circuit boards made directly from the original copy by the method of the present invention exhibit exceptionally good peel strength characteristics, due to the fact the V-shaped cutter stylus eliminates undercutting. Moreover, use of the present invention eliminates film, camera, darkroom, developer, acid etching and the need for trained personnel.

The size of the blank circuit board material can of course be varied, and the maximum size depends upon the size of the cylinders of the engraving machine. One example of a relatively large printed circuit board blank is 12 x 18 inches, and it will be understood that if the desired printed circuit is substantially smaller than the blank, then it is possible to wrap a plurality of circuit drawings on the scanning cylinder and thereby form a plurality of printed circuits on a single sheet of board material. Relative to the operating characteristics of the engraving machine, good resolution has been achieved using a scanning rate of 325 passes per inch in conjunction with a machine capable of reproducing lines 0.008 inch in thickness and between-line spaces of 0.008 inch.

It is important to note that in a great many applications it is desired to produce a printed circuit board which is relatively rigid. For example, one common thickness for a printed circuit board is approximately 1/16 inch or 0.0625 inch. As noted earlier, the present invention contemplates that the circuit board blank which is wrapped on the cutting cylinder should not have a thickness in excess of 0.035 inch. However, in accordance with the present invention the finished circuit board may be made more rigid subsequent to the cutting operation by laminating the same to an additional layer of backing material or the like.

A convenient technique for accomplishing the foregoing is to use an additional layer of the same backing material, such as fibre glass, but without any copper surface layer thereon. The finished printed circuit board and the additional layer of backing material are coated with an adhesive such as Dow-Corning Glass-Ceramic Adhesive, after which the two boards are pressed together and allowed to set for one hour. Thus, a relatively flexible finished board having a total thickness of 0.032 inch including the copper layer can be laminated to a layer of backing material of a thickness of 0.030 inch so as to produce a final circuit board which is relatively rigid and has a total thickness of 0.062 inch. Consequently, the final product may be of any desired thickness and rigidity, while the circuit board blank used for the cutting operation should be a relatively flexible material not exceeding 0.035 inch thickness.

The present invention eliminates previously encountered problems relative to size instability and will cut a printed circuit which is substantially precisely the same size as the original copy. In this connection, however, it should be noted that the cutting cylinder is preferably made slightly smaller in diameter than the scanning cylinder to offset the difference in thickness between the sheet of copy material and the blank printed circuit board material. It will also now be more fully understood that while blank circuit boards used in the photo-chemical etching process could not be pre-soldered or pre-tinned since such a coating would act as a resist to the action of the acid, yet a tungsten carbide stylus will readily cut through a solder-tinned coating, and it is thus preferable to use electroplated pre-tinned blank printed circuit board material in the cutting operation of the present invention. The use of such material eliminates the necessity to clean and plate and copper-clad boards after the circuits are formed therein. Moreover, solder-tinned coating ensures firm bonding of the components to the board, and eliminates oxidation during storage. The finished board also will not require a chlorthane bath or the like to remove foreign substances.

While I have described my invention in certain preferred forms, I do not intend to be limited to such forms, except insofar as the appended claims are so limited, since modifications coming within the scope of my invention will readily occur to those skilled in the art, particularly with my disclosure before them.

I claim:

1. A method of making a printed circuit board directly from original copy on an engraving machine of the type having rotatable scanning and cutting cylinders, a corresponding light-sensitive scanner member, and a cutter member the latter of which includes a cutting stylus which is controlled by electrical impulses from the light-sensitive scanner member, said method comprising the steps of preparing a sheet of copy material illustrating a desired circuit design, wrapping said sheet of copy material on said scanning cylinder and securing the same thereto, wrapping a laminated sheet of blank circuit board material on said cutting cylinder and securing the same thereto, said blank circuit board material having a backing layer of insulating material and a surface layer of electrically conductive metal and having a total thickness in the approximate range of 0.005 inch to 0.035 inch, operating said engraving machine so as to rotate said scanning and cutting cylinders and scan said copy material with said light-sensitive scanner member while using said cutting stylus to cut said circuit board material in substantially all areas thereon except those corresponding to the illustration of the circuit design on said copy material, controlling the depth of cut of said cutting stylus so that in those areas where it is operative it cuts through and completely removes the surface layer of conductive metal from the backing layer of insulating material thereby leaving the conductive metal surface layer only in those areas corresponding to the circuit design as shown on the copy material.

2. The method of claim 1 including the step carried out after the completion of the cutting operation of laminating to the printed circuit board through the use of adhesive an additional layer of backing material so as to substantially increase the thickness and rigidity of the finished printed circuit board.

3. The method of claim 1 including the step carried out prior to the cutting operation of applying to the surface of the conductive metal layer a coating of solder to facilitate the subsequent soldering of components thereto.

4. The method of claim 3 where said circuit board material comprises a backing layer of insulating material and a surface layer of copper, including the step of electroplating a coating of solder to the copper surface prior to the cutting operation.

5. The method of claim 1 where said copy material is prepared by making a hand drawing of the desired circuit design.

6. The method of claim 1 including the use of a stop member to limit the stroke of the cutting stylus thereby causing the cutting stylus to operate with a substantially uniform stroke during the entire cutting operation, said stroke being controlled so that said stylus cuts completely through the surface layer of conductive metal while leaving the major portion of the thickness of the backing layer of insulating material.

7. The method of claim 1 where a V-shaped cutting stylus is utilized to remove the conductive metal surface layer from the layer of insulating material.

8. The method of claim 1 where said copy material comprises positive copy, and where said scanner and cutter members are electrically connected so that said cutting stylus will assume a cutting position whenever said scanner member senses a light area on said copy material and will assume a non-cutting position whenever said scanner member senses a dark area on said copy material, and where said scanner and cutter members are mechanically interconnected so as to be advanced in the same axial direction during the cutting operation.

9. The method of claim 1 including the step carried out prior to the cutting operation of punching a plurality of holes in the two extreme end portions of the circuit board material, applying heat to said end portions, and bending said end portions out of the plane of the board material.

10. A method of making a printed circuit board directly from original copy on an engraving machine of the type having rotatable scanning and cutting cylinders, a corresponding light-sensitive scanner member, and a cutter member the latter of which includes a V-shaped cutting stylus which is controlled by electrical impulses from the light-sensitive scanner member, said method comprising the steps of preparing a sheet of copy material illustrating a desired circuit design, wrapping said sheet of copy material on said scanning cylinder and securing the same thereto, wrapping a laminated sheet of blank circuit board material on said cutting cylinder and securing the same thereto, said blank circuit board material having a backing layer of insulating material, a surface layer of copper and an electroplated coating of solder on the copper surface layer, and said circuit board material having a total thickness in the approximate range of 0.005 inch to 0.035 inch, operating said engraving machine so as to rotate said scanning and cutting cylinders and scan said copy material with said light-sensitive scanner member while using said V-shaped cutting stylus to cut said circuit board material in substantially all areas thereon except those corresponding to the illustration of the circuit design on said copy material, using a stop member to limit the stroke of said cutting stylus thereby causing the cutting stylus to operate with a substantially uniform stroke during the entire cutting operation, said stroke being controlled so that said V-shaped cutting stylus cuts through the surface layer of copper so as to completely remove the same while leaving the major portion of the thickness of the backing layer of insulating material, thereby leaving the copper surface layer only in those areas corresponding to the circuit design as shown on the copy material, and removing the printed circuit board from the cutting cylinder after the cutting operation and laminating the same through the use of adhesive to an additional layer of backing material so as to substantially increase the thickness and rigidity of the finished printed circuit board.

References Cited

UNITED STATES PATENTS

| | | | |
|---|---|---|---|
| 3,183,745 | 5/1965 | Barron | 82—11 |
| 3,331,127 | 7/1967 | Kerkoht | 29—625 |
| 3,340,161 | 9/1967 | Zimmerman | 204—15 |
| 3,479,452 | 11/1969 | Hancock et al. | 178—6.6 |

JOHN F. CAMPBELL, Primary Examiner

D. M. HEIST, Assistant Examiner

U.S. Cl. X.R.

82—11